(12) United States Patent
Beaupré-Laflamme et al.

(10) Patent No.: US 12,205,920 B2
(45) Date of Patent: Jan. 21, 2025

(54) ENHANCED THERMAL CONTROL OF A HYBRID CHIP ASSEMBLY

(71) Applicant: Ciena Corporation, Hanover, MD (US)

(72) Inventors: Raphael Beaupré-Laflamme, Quebec (CA); François Pelletier, Quebec (CA); Louis-Philippe Bibeau, Saint-Augustin-de-Desmaures (CA)

(73) Assignee: Ciena Corporation, Hanover, MD (US)

( * ) Notice: Subject to any disclaimer, the term of this patent is extended or adjusted under 35 U.S.C. 154(b) by 388 days.

(21) Appl. No.: 17/592,037

(22) Filed: Feb. 3, 2022

(65) Prior Publication Data
US 2023/0245993 A1 Aug. 3, 2023

(51) Int. Cl.
| | | |
|---|---|---|
| *H01L 23/00* | (2006.01) | |
| *H01L 23/13* | (2006.01) | |
| *H01L 25/00* | (2006.01) | |
| *H01L 25/065* | (2023.01) | |

(52) U.S. Cl.
CPC ............ *H01L 24/32* (2013.01); *H01L 23/13* (2013.01); *H01L 24/83* (2013.01); *H01L 25/0657* (2013.01); *H01L 25/50* (2013.01); *H01L 2224/32145* (2013.01); *H01L 2224/32225* (2013.01); *H01L 2224/83855* (2013.01)

(58) Field of Classification Search
CPC ..... H01L 23/13; H01L 24/83; H01L 25/0657; H01L 25/50; H01L 24/32; H01L 2224/32145; H01L 2224/32225; H01L 2224/83855; H10B 80/00
USPC .................................. 257/777, 704
See application file for complete search history.

(56) References Cited

U.S. PATENT DOCUMENTS

| | | |
|---|---|---|
| 10,677,986 B1 | 6/2020 | Pelletier |
| 11,227,790 B1 | 1/2022 | Filion et al. |
| 2004/0150962 A1* | 8/2004 | Heinemann ...... G06K 19/07745 257/E23.064 |

(Continued)

FOREIGN PATENT DOCUMENTS

| | | |
|---|---|---|
| JP | S5548943 A | 4/1980 |
| TW | 201106458 A | 2/2011 |

OTHER PUBLICATIONS

Anonymous, "Encapsulating thermal interface for hybrid integration in Silicon Photonics" An Ip.com Prior Art Database Technical Disclosure, IP.Com, IPCOM000263947D, Oct. 25, 2020, https://priorart.ip.com/IPCOM/000263947.

*Primary Examiner* — Jasmine J Clark
(74) *Attorney, Agent, or Firm* — Young Basile Hanlon & MacFarlane, P.C.

(57) ABSTRACT

A method including disposing a structural adhesive onto an elevated surface of a first chip that includes a cavity disposed below the elevated surface. The method includes contacting a carrier with the structural adhesive. The carrier includes a second chip that optically aligns with a lateral surface of the cavity. The method includes curing the structural adhesive so that the carrier and host chip are mechanically anchored. An apparatus includes a first chip including a cavity located between lateral walls of the first chip and a carrier mechanically anchored with the first chip at a top portion of the lateral walls. The carrier includes a second chip that optically aligns with the first chip at a side portion of one of the lateral walls. The first and second chips are free of contact at a bottom surface of the second chip and a bottom surface of the cavity.

13 Claims, 8 Drawing Sheets

(56) References Cited

U.S. PATENT DOCUMENTS

2008/0318360 A1     12/2008   Chen et al.
2020/0168523 A1      5/2020   Huang et al.
2022/0187550 A1      6/2022   Baudot et al.

* cited by examiner

ENHANCED THERMAL CONTROL OF A HYBRID CHIP ASSEMBLY

TECHNICAL FIELD

This disclosure relates to an apparatus including at least two chips that are arranged to optically align and reduce heat transfer between the two chips.

BACKGROUND

Modern devices with semi-conductor chips generate high amounts of heat during operation. The generation of heat among small components such, as the semi-conductor chips, adhesives, and the like, can cause some of the internal components to be misaligned due to thermal expansion. The misalignment inhibits efficient operation of the chips. Additionally, high amounts of heat can cause the adhesives used to adhere the chips together to fracture, which further negatively affects the alignment of the chips. This may be problematic in some circumstances because repairing these small components can be difficult once the larger device is assembled. Further, temperature differences between two chips may lead to heat transfer between the chips, which is undesirable in a power sensitive environment.

SUMMARY

In some aspects, in general, an apparatus including two chips can be configured such that the two chips are free of direct contact. This can be achieved by having a first chip with a cavity and a second chip affixed to carrier, and the carrier is directly affixed to the first chip such that the second chip is located within the cavity but free of direct contact with the cavity. With this configuration, the transfer of heat between the first and second chips is mitigated, and since both chips are linked only with a single mechanical interface, the over constraint due to multiple bonded joints is avoided.

In one aspect, in general, the present disclosure provides a method including disposing a structural adhesive onto an elevated surface of a first chip, and the first chip includes a cavity disposed below the elevated surface. The method includes contacting a carrier with the structural adhesive, and the carrier includes a second chip that optically aligns with a lateral surface of the cavity. The method includes curing the structural adhesive so that the carrier and host chip are mechanically anchored.

In another aspect, in general, the present disclosure provides an apparatus includes a first chip including a cavity located between lateral walls of the first chip. The apparatus includes a carrier mechanically anchored with the first chip at a top portion of the lateral walls, and the carrier includes a second chip that optically aligns with the first chip at a side portion of one of the lateral walls. The first and second chips are free of contact at a bottom surface of the second chip and a bottom surface of the cavity.

In another aspect, in general, the present disclosure provides an apparatus includes a first chip including a cavity and a carrier mechanically anchored with one or more elevated surfaces of the first chip. The carrier includes a second chip that is thermally connected with the carrier at a bottom surface of the carrier and a top surface of the second chip. The carrier includes extensions that protrude from the bottom surface of the carrier and mechanically anchor lateral surfaces of the second chip to the carrier.

Aspects can include one or more of the following features.

The method may further include connecting the lateral surface of the cavity and a lateral surface of the second chip with an optical adhesive. The method may further include connecting the carrier and the second chip with a carrier adhesive. The step of connecting the carrier and the second chip with the carrier adhesive may include contacting the second chip and the carrier adhesive; contacting the carrier and the carrier adhesive; and curing the carrier adhesive so that the carrier and the second chip are mechanically connected. The second chip may be free of contact with a bottom surface of the cavity of the first chip. The carrier may further include extensions that protrude from a bottom surface of the carrier and mechanically anchor lateral surfaces of the second chip to the carrier. The carrier further includes a protrusion that extends a distance from a bottom surface of the carrier and connects with the second chip so that optical alignment is assisted between the second chip and the lateral surface of the cavity. The protrusion may be present to ensure a known adhesive gap thickness so that the apparatus is athermal between the components.

The second chip and the carrier may be mechanically anchored together by a carrier adhesive that is thermally conductive. The carrier and the first chip may be mechanically anchored at the top portion of the lateral walls by a structural adhesive. The carrier may further include a protrusion that extends a distance from a bottom surface of the carrier and connects with the second chip. The protrusion may connect with the second chip by a carrier adhesive that is thermally conductive, and the protrusion may include appendages that extend from the protrusion and contact the second chip so that the second chip connects with the protrusion and so that a top surface of the second chip and a bottom surface of the carrier are parallel. The carrier may further include extensions that protrude from the bottom surface of the carrier and mechanically anchor lateral surfaces of the second chip to the carrier so that a top surface of the second chip and the bottom surface of the carrier are aligned in a parallel orientation. The extensions may mechanically anchor the lateral surfaces of the second chip by an extension adhesive. The carrier may further include a thermal interface material that regulates energy between the second chip and the carrier, and the bottom surface of the carrier and the top surface of the second chip may be free of contact.

The second chip may be connected with the first chip at the lateral walls of the cavity by an optical adhesive. The second chip may be free of contact with the first chip at a bottom surface of the second chip and a bottom surface of the cavity. The second chip may be configured to optically align with the first chip at lateral surfaces of the cavity. The second chip may be connected with the first chip at a lateral wall of the cavity by an optical adhesive.

Aspects can have one or more of the following advantages.

The apparatuses and methods described herein include configurations that reduce and/or increase thermal crosstalk between chips as required by the specific heat management scenario. A problem can arise when two chips are affixed together with a structural adhesive because the heat generated by the two chips may cause the structural adhesive to expand and potentially crack. This expansion can also cause other adjacent adhesives, like optical adhesives, to crack, which ultimately causes the first and second chips to be misaligned, which negatively impacts performance. Additionally, the thermal crosstalk between the chips is undesirable because there can be a loss of energy (i.e., power consumption) from a larger device (e.g., a camera, cell phone, or other electronic device) due to the undesirable regulation of temperature between the two chips.

Some configurations described herein separate the first and second chips so that a top surface of the second chip is affixed to a carrier; the carrier is connected with the first chip; and second chip is free of contact with the first chip on at least a bottom surface of the second chip. During use of the first and second chips, heat is generated, and being free of contact at the bottom surface of the second chip reduces the transfer of thermal energy between the first and second chips. Thus, the first and second chips can operate with a better efficiency. Additionally, since the thermal crosstalk is reduced, there is a lower chance for one or more of the adhesives being used to expand and/or crack, which could impact the alignment of the first and second chips. Even minor expansions that do not cause cracks can negatively impact or prevent proper alignment of two chips.

The apparatuses and method described herein include configurations of a first chip, second chip, and carrier that can be arranged such that the second chip is athermal. In other words, athermal means that as the first and second chips are in use and generating heat the second chip does not move relative to the first chip. Not moving is helpful in some configurations because if the second chip moves as one or more components expand due to heat the first and second chips may become misaligned and, therefore, inefficient or inoperable. In this example, being athermal is based on the coefficients of thermal expansion and the relative heights of one or more of the components. For example, the first chip and carrier are connected by a structural adhesive, the carrier can include a protrusion that extends towards the second chip, and the second chip can be connected with the protrusion by a carrier adhesive. In some examples, for the second chip to be athermal, the product of the coefficient of thermal expansion and height for the structural adhesive must be equal to the sum of the product of the coefficient of thermal expansion and height for the carrier adhesive and the product of the coefficient of thermal expansion and height for the protrusion. In other examples, where a protrusion is not included, the second chip is athermal where the coefficient of thermal expansion and height for the structural adhesive is equal to the product of the coefficient of thermal expansion and height for the carrier adhesive.

The apparatuses described herein can include a gap feature that improves the parallelism between the second chip and the carrier. Specifically, the carrier may include a pair of appendages having even heights that extend from the bottom surface of the carrier, and between the appendages is a space that is configured to house a carrier adhesive. The second chip contacts the appendages and the carrier adhesive, and since the appendages have even heights, the top and/or bottom surfaces of the second chip are parallel relative to the bottom surface of the carrier. When the second chip and the carrier are parallel, the first and second chips may be aligned more easily and with greater precision.

The apparatuses described herein can have a carrier that mechanically anchors with the second chip at lateral surfaces, which allows a thermal interface material to be implemented between a top surface of the second chip and a bottom surface of the carrier, so that energy (e.g., heat) transfer is improved between the carrier and the second chip. This allows the carrier to operate as a heatsink. Specifically, in such examples, the carrier includes extensions that extends from a bottom surface of the carrier towards the second chips. The thermal interface material separates the bottom surface of the carrier and the second chip, and the extensions mechanically anchor the second chip at lateral surfaces of the second chip using a carrier adhesive at the lateral surfaces. With this configuration, the thermal interface material, which is generally more efficient in transferring energy between two components than an adhesive, can be used to form a highly efficient point of energy transfer between the second chip and the carrier. Having a highly efficient point of energy transfer between the second chip and the carrier can improve the operation performance of the second chip before the second chip overheats. Additionally, with the absence of a carrier adhesive at the top surface of the second chip, the physical stress on the top surface of the second chip is reduced.

The methods described herein provide for the formation of a carrier which can be assembled with the first chip in a fashion that improves the rate of production for the apparatuses. By initially forming an assembly of the second chip, carrier adhesive, and carrier on a tape before assembly with the first chip, many assemblies of the second chip, carrier adhesive, and carrier can be assembled on a single piece of tape. Generally, assembling the first chip, the second chip, and the carrier was previously all done from the bottom up on the first chip, which had numerous sequential steps. With the preassembled carrier combination, the number of steps for assembling carrier and the first chip can be reduced. Additionally, by preassembling the carrier and the second chip, the carrier adhesive can be cured before connecting the carrier and the second chip. Accordingly, the carrier adhesive can be cured before being sandwiched within the cavity of the first chip.

With the carrier assembly on the single piece of tape, low impact tools (e.g., vacuum tools) can be used to move the carrier into mechanical connection with the first chip, without directly gripping the second chip. By not directly grabbing or gripping the second chip, stress on the second chip and the chance of damaging the second chip during assembly is reduced.

By using the above methods of assembly, variations in the assembly within the cavity of the first chip can be reduced. For example, in other methods where the second chip is directly affixed to the cavity of the first chip by a structural adhesive, the alignment of the first and second chips can be variable because it can be difficult to apply the same amount of structural adhesive at each cavity. Additionally, the structural adhesive may not cure at the same height, and thus, there is variability between different apparatuses. By simply connecting the carrier and the first chip, the second chip can be aligned within the cavity with better precision in each apparatus on an assembly line.

Other features and advantages will become apparent from the following description, and from the figures and claims.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

In some examples, an apparatus includes first and second chips that are free of direct contact and optically aligned such that the first and second chips can efficiently operate efficiently without detrimental impairment due to misalignment. To facilitate the connection between the first and second chips, a carrier includes the second chip, and the carrier is structurally connected with the first chip so that energy transfer between the first and second chips is mitigated. For example, a top surface of the second chip may be connected with the carrier, a bottom surface of the second chip may be free of contact with the first chip, and one or more lateral surfaces of the second chip may be optically aligned with one or more lateral surfaces of the first chip so that the first and second chips can interact with simply an optical adhesive between the lateral surfaces or without direct physical connection (i.e., the carrier is the intervening connection piece). With this configuration, the first and second chips may be used with a better efficiency, and the generation of heat by the first and second chips does not inhibit the alignment of the first and second chip during usage. Additionally, because the first and second chips are connected with the carrier, the carrier can operate as a dual component heatsink, which improves the operation times of the first and second chips before overheating.

Figure 1:
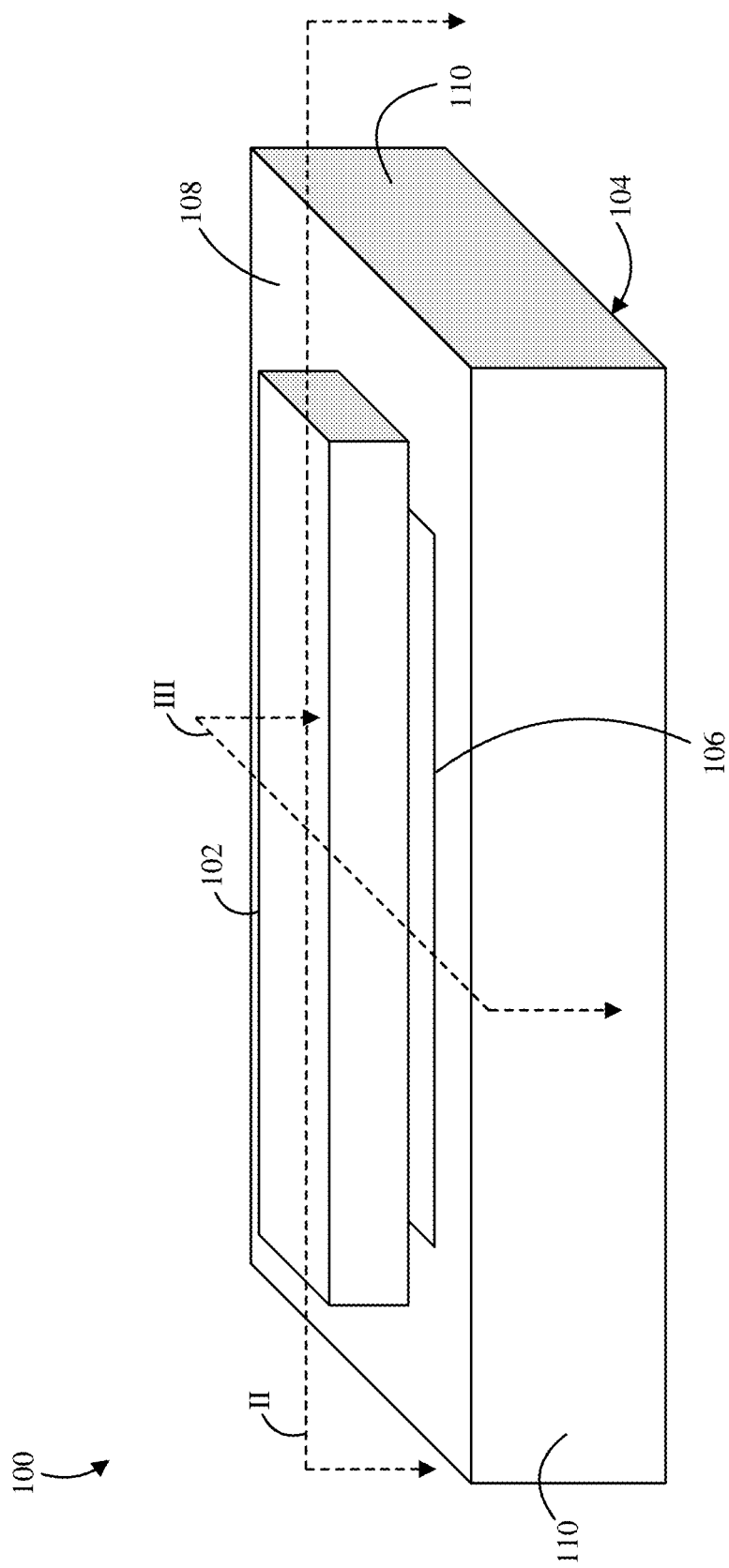
FIG. 1 is a perspective view of an apparatus.

FIG. 1 is a perspective view of an apparatus 100. The apparatus 100 includes a carrier 102 and a first chip 104. The first chip 104 includes a cavity 106, and the first chip 104 is connected with the carrier 102 at the elevated surface 108 of the lateral walls 110 so that the carrier 102 is positioned over the cavity 106.

The apparatus 100 may be integrated into any device that includes at least two chips. For example, the apparatus 100 may be included in a camera, phone, computer, GPS, optical transmission device, opto-electronic assembly, data transmission devices, or any other electronic, optical or opto-electronic device that includes two chips. The apparatus 100 may be positioned within a housing (not shown) that may include other components or apparatuses (not shown). The apparatus can be part of a larger group processed together onto a single substrate or wafer, as it can be advantageous to have them grouped precisely together for ease of assembly. The apparatus 100 may be connected with one or more other components at the carrier 102 and/or the first chip 104. For example, the carrier 102 and/or first chip 104 may be connected with a component that is configured to conduct energy, such as a conductor, heatsink, ground, thermo-electric cooler, or any combination thereof. In other examples, the carrier 102 is free of contact with any other components, besides the first and second chips.

The first chip 104 functions to align with another chip (e.g., the second chip 120 of FIGS. 2-8C) and to support the carrier 102. The first chip 104 may have any configuration that includes a cavity 106 with at least one wall that is sufficient to align with another chip. The first chip 104 may have a shape that is square (shown), rectangular, circular, oval, triangular, pentagonal, U-shaped, V-shaped, hexagonal, octagonal, or any combination thereof. The first chip 104 may be completely enclosed around the cavity 106 (see e.g., FIG. 1), or the first chip may have one or more portions of the cavity that lack lateral walls 110. The first chip 104 may include any material sufficient to support a carrier and function as host chip. For example, the first chip 104 may include silicon, indium, phosphorus, gallium, germanium, arsenic, oxygen, nitrogen, or any combination thereof. The first chip 104 may have any length or width sufficient to allow the carrier 102 to be positioned on a top surface of the first chip 104. For example, the first chip 104 may have a length and/or width of about 1 mm to about 350 mm. The first chip 104 may have any height sufficient to have lateral walls 110 that extend from a bottom surface and form a cavity 106. For example, the first chip 104 may have a height of about 0.02 mm to about 2 mm. The width of the lateral walls 110 may be any dimension sufficient to support the carrier 102.

Figure 2:
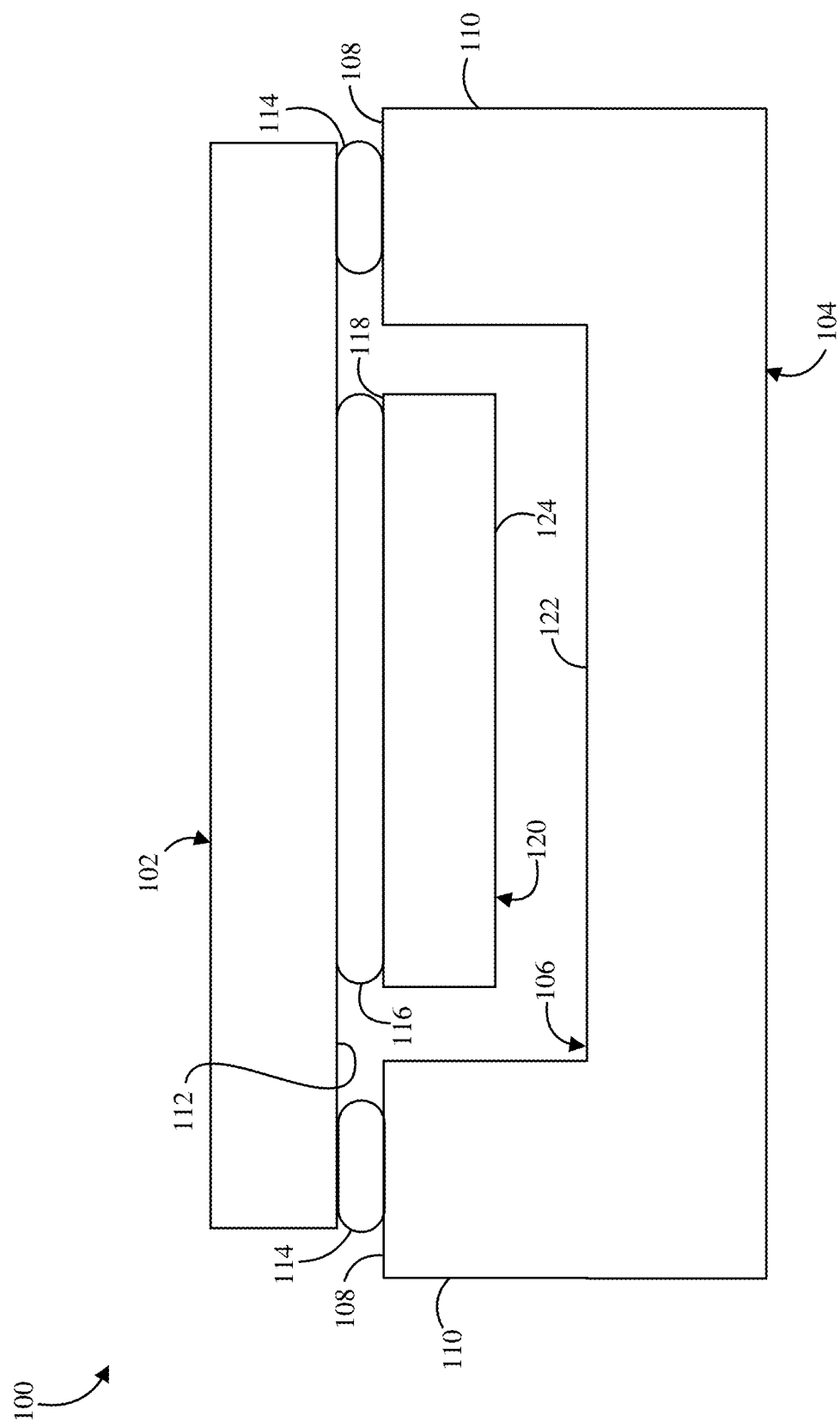
FIG. 2 is a cross-section view of one example of the apparatus along line II.

FIG. 2 is a cross-section view of one example of the apparatus 100 along line II. At a bottom surface 112 of the carrier 102, the first chip 104 includes a structural and or thermal adhesive 114 positioned on the elevated surfaces 108 of the lateral walls 110 to connect the first chip 104 and the carrier 102. A carrier adhesive 116 connects a top surface 118 of a second chip 120 and the bottom surface 112 of the carrier. The second chip 120 may be positioned relative to the first chip 104 such that the first and second chips 104, 120 are optically aligned and configured to communicate and/or interact with each other. As shown, the second chip 120 and the carrier 102 are connected relative to the first chip 104 such that first and second chips 104, 120 are free of contact at a bottom surface 122 of the cavity 106 and a bottom surface 124 of the second chip 120. Since the bottom surfaces 122, 124 are free of contact, the transfer of thermal energy between the first and second chips 104, 120 is controlled. In some examples, the only portion of connection between the first and second chips 104, 120 may be at one lateral wall 110 of the first chip 104 and one lateral surface (i.e., the lateral surface 128 of FIG. 3). In some examples, the first and second chips 104, 120 are connected at the lateral wall 110 and lateral surface of the second chip 120 by an optical adhesive (i.e., optical adhesive 126 of FIG. 3).

The second chip 120 functions to optically align with the first chip 104 so that the first and second chips 104, 120 can interact or communicate. The second chip 120 may be described or configured as a companion chip relative to a host chip, such as the first chip 104. The second chip 120 may be composed of any material sufficient to optically align with the first chip 104. For example, the second chip 120 may include one or more of silicon, indium, phosphorus, gallium, germanium, arsenic, oxygen, nitrogen or any combination thereof. The second chip 120 may have any height sufficient to remain aligned with the first chip 104 when heat is being generated and one or more components of the apparatus 100 have expanded are expanding due to heat. For example, the second chip 120 may have a height of about 0.1 mm to about 30 mm. The second chip 120 may be configured in any shape such that the second chip 120 may be positioned within the cavity 106 and optically align with the first chip 104. For example, the second chip 120 may have a similar or same shape as a shape of the cavity 106 (e.g., a square shape or rectangular shape). The second chip 120 may have any configuration sufficient to connect with the carrier 102 and be free of contact with the first chip 104 at the bottom surface 124.

The carrier 102 functions to support the second chip 120. The carrier 102 may have any shape or configuration sufficient to support the second chip 120 over the cavity 106. The carrier 102 may have any width sufficient to rest over the cavity 106 of the first chip 104. For example, the carrier 102 have at least two points of connection with the lateral walls 110 of the first chip (e.g., see FIG. 1). For example, the carrier 102 may have a width of about 0.1 mm to about 30 mm. The carrier 102 may have any height sufficient to support second chip 120 over the cavity 106 and keep the second chip 120 aligned with the first chip 104 when one or more components of the apparatus 100 are expanding due to heat. For example, the carrier 102 may have a height of about 0.05 mm to about 5 mm. The combination of the height and the width of the carrier 102 may be chosen so that the energy regulation properties (e.g., thermal regulation) of the carrier 102 are improved so that the first and/or second chips 104, 120 do no overheat or become damaged during use. In other words, the carrier 102 may function as a heatsink, conductor, and/or ground that regulates energy during operation of the first and/or second chips 104, 120. The carrier 102 may include one or more portions that extend from the bottom surface 112 of the carrier 102 so that the second chip 120 can be properly aligned with the first chip 104. For example, the carrier 102 may include a protrusion (e.g., protrusion 132 of FIG. 4) that improves the positioning of the carrier 102 and/or second chip 120 relative to the first chip 104. Other protrusions (not shown) may be included at the point of contact between the structural adhesive 114 and the bottom surface 112 of the carrier 102. The carrier 102 may have any coefficient of thermal expansion sufficient to cause or assist with the second chip 120 being athermal. The compound or material or combination of compounds or materials for the carrier 102 may be chosen based on the desired coefficient of thermal expansion for the carrier 102.

The structural adhesive 114 functions to provide a connection means between the first chip 104 and the carrier 102. The structural adhesive 114 may function to regulate energy between the carrier 102 and the first chip 104. The structural adhesive 114 may function to align the first and second chips 104, 120 when the carrier 102 is connected with the structural adhesive 114. The structural adhesive 114 may be applied in any amount sufficient to connect the first chip 104 and the carrier and to provide sufficient alignment of the first and second chips 104, 120. The structural adhesive 114 may have any height sufficient to keep the first and second chips 104, 120 aligned when one or more components of the apparatus 100 are generating energy and one or more components are expanding due to heat exposure. For example, the structural adhesive 114 may have a height of about 0.001 mm to about 0.2 mm. The structural adhesive 114 may be applied evenly on both sides of the carrier 102 at the elevated surface 108 so that the first and second chips 104, 120 can be properly aligned. In other examples, a lateral wall 110 on the right side (as viewed in FIG. 2) of the first chip 104 may have more structural adhesive 114 than a left side of the first chip 104 so that a specific alignment of the first and second chips 104, 120 may be achieved. The structural adhesive 114 may have a height that is configured to have a thermal expansion relationship with the carrier 102, the carrier adhesive 116, or both, as described herein. For example, the height of the structural adhesive 114 may be chosen based on the coefficient of thermal expansion and/or the height of the carrier adhesive 116, the carrier 102, or both. The structural adhesive 114 may include any material sufficient to connect the first chip 104 and the carrier 102 and/or keep the first and second chips 104, 120 aligned when one or more components expand during operation of the apparatus 100. The structural adhesive 114 may include one or more materials that improve energy regulation (e.g., thermal heat management) between the first chip 104 and the carrier 102. In other words, the structural adhesive 114 may regulate energy to the carrier 102 during operation of the first chip 104 so that the duration and/or performance of use for the first chip 104 is improved. The material of the structural adhesive 114 may be chosen based on the coefficient of thermal expansion for the material or combination of materials used relative to the height and/or coefficient of thermal expansion for the carrier 102, the carrier adhesive 116, or both. For example, the structural adhesive 114 may include a material selected from one or more of an epoxy, siloxane, cyanoacrylate, acrylate, silicone, or any combination thereof. The structural adhesive 114 and the carrier adhesive 116 may include similar or different compounds, depending on bond line considerations for either adhesive or whether thermal conductivity is desired in either adhesive during operation. The structural and/or carrier adhesives 114, 116 may include a filler that is selected to reduce the adhesive thermal expansion while keeping the adhesive either thermally conductive or thermally isolating. The structural adhesive 114 may have any coefficient of thermal expansion sufficient to cause or assist with the second chip 120 being athermal. The compound or material or combination of compounds or materials of the structural adhesive 114 may be chosen based on the desired coefficient of thermal expansion for the structural adhesive 114. For example, the structural adhesive 114 may have a coefficient of thermal expansion of about 1 ppm/° C. to about 200 ppm/° C.

The carrier adhesive 116 functions to connect the second chip 120 and the carrier 102. The carrier adhesive 116 may function to regulate energy between the carrier 102 and the second chip 120. The carrier adhesive 116 may include any material or compound sufficient to connect and/or regulate energy between the carrier 102 and the second chip 120. For example, the carrier adhesive 116 may include one or more of epoxy, siloxane, cyanoacrylate, acrylate, silicone, polymers thereof, or any combination thereof. The carrier adhesive 116 may cover the entire or a portion of top surface 118 of the second chip 120. In other words, a portion of the top surface 118 of the second chip 120 may be free of contact with the carrier adhesive 116. The carrier adhesive 116 may have any height sufficient to align the first and second chips 104, 120 during operation of the apparatus 100. For example, the carrier adhesive 116 may have a height of about 0.001 mm to about 0.2 mm. The materials and/or compounds of the carrier adhesive 116 may be chosen such that the carrier adhesive 116 has a coefficient of thermal expansion and/or height that has a mathematical relationship with the coefficient of thermal expansion and/or height of the carrier 102, the structural adhesive 114, or both. In some examples, the carrier adhesive 116 may be used in combination with a thermal interface material (e.g., thermal interface material 141 of FIG. 6). Where a thermal interface material is used, the thermal interface material and the carrier adhesive 116 may be positioned at different surfaces of the second chip 120 (e.g., the top surface 118 and lateral surfaces of the second chip 120) so that undesirable interactions between the carrier adhesive 116 and the thermal interface material are avoided. In other examples, the thermal interface material and the carrier adhesive 116 may be positioned at the same side of the second chip 120 (e.g., the top surface 118) to simplify the components of the carrier 102 and/or second chip 120 and/or improve the energy conduction between the carrier 102 and the second chip 120. The carrier adhesive 116 may have any coefficient of thermal expansion sufficient to cause or assist with the second chip 120 being athermal. The compound or material or combination of compounds or materials of the carrier adhesive 116 may be chosen based on the desired coefficient of thermal expansion for the carrier adhesive 116. For example, the carrier adhesive 116 may have a coefficient of thermal expansion of about 1 ppm/° C. to about 250 ppm/° C.

Figure 3:
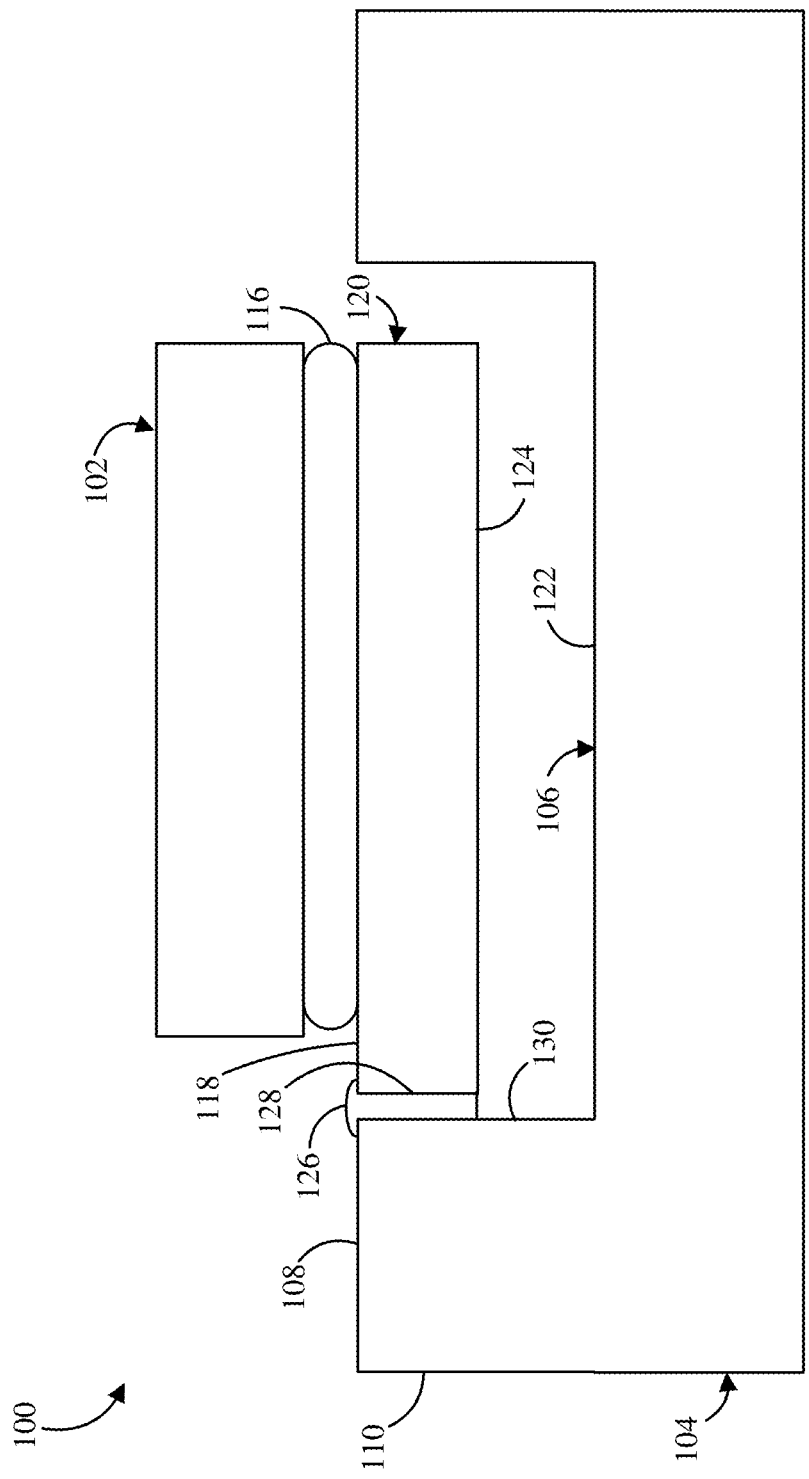
FIG. 3 is a cross-section view of the apparatus along line III.

FIG. 3 is a cross-section view of the apparatus 100 along line III. The carrier 102 is connected with the first chip 104, as shown in FIG. 2, and the second chip 120 is connected with the first chip 104 by an optical adhesive 126. Specifically, the optical adhesive 126 connects the first and second chips 104, 120 at a lateral surface 128 of the second chip 120 and a lateral surface 130 of the cavity 106 so that the first and second chips 104, 120 are laterally aligned. The first and second chips 104, 120 may be aligned at any point along the lateral surface 130 of the cavity 106 of the first chip 104 and the lateral surface 128 of the second chip 120. The point of alignment for the second chip 120 may positioned at the top surface 118, the bottom surface 124, or between the top and bottom surfaces 118, 124 of the second chip 120. The point of alignment for the lateral surface 130 of the cavity may be at the corner of the lateral surface 130 and the elevated surface 108 or any point above the bottom surface 122 or below the corner.

The first and second chips 104, 120 are shown as connected in FIG. 3. In other examples, the first and second chips 104, 120 may be connected without an optical adhesive 126 or other intervening compound or material. In some examples, the first and second chips 104, 120 may be free of physical contact where the first and second chips 104, 120 do not utilize optical alignment or where the first and second chips 104, 120 do not communicate directly. In some examples, the first and second chips 104, 120 are connected with each other at more than one lateral surface 130 of the cavity. For example, second chip 120 may contact the lateral surface 130 of the cavity 106 at one or more portions, two or more portions, three or more portions, four or more portions, or any number of portions sufficient to operate the first and second chips 104, 120 in a desirable fashion.

The cavity 106 functions to house the second chip 120 when the first chip 104 and the carrier 102 are connected. The cavity 106, in combination with the lateral walls 110, may have any shape sufficient to allow the second chip 120 to align with the first chip 104 when the carrier 102 is connected with the first chip 104. For example, the cavity 106 may have a shape of a circle, oval, square, rectangle, pentagon, hexagon, heptagon, or any combination thereof. The shape of the cavity 106 may be chosen based on a shape of the second chip 120. The bottom surface 122 and the lateral surface 130 of the cavity 106 may contact at a rounded or sharp corner depending on the configuration of the second chip 120. The bottom surface 122 may have a configuration that is flat, uneven, rounded, or any combination thereof so long as the configuration of the bottom surface 122 does not allow the first and second chips 104, 120 to contact and/or does not interfere with alignment between the first and second chips 104, 120. The cavity 106 may be free of contact with the second chip 120, except in examples where a lateral surface 130 of the cavity 106 contacts a lateral surface 128 of the second chip 120, so that the energy transfer between the first and second chips 104, 120 is reduced during operation of the first and second chips 104, 120.

The optical adhesive 126 functions to regulate energy or optical waves between the first and second chips 104, 120. The optical adhesive 126 may be used to increase the optical transfer between the first and second chips 104, 120 by controlling the refractive index or preventing the creation of interference pattern between the first and second chips 104, 120 due to refractive index mismatch. The optical adhesive 126 may have any width between the lateral surfaces 128, 130 sufficient to form a connection and regulate optical waves. For example, the optical adhesive 126 may have a width of about 0.05 um to about 200 um. The optical adhesive 126 may be positioned along the entire or a portion of the lateral surface 128 of the second chip 120. The optical adhesive 126 may be applied to the second chip 120 and the lateral wall 110 such that the optical adhesive 126 does not leak, drip, or overflow in such a manner that contaminates the bottom surface 122 of the cavity 106. The optical adhesive 126 may be applied before or after curing one or more other adhesives of the apparatus 100, such as the structural adhesive 114 and/or the carrier adhesive 116. The optical adhesive 126 may include any material or compound sufficient to regulate optical waves between the first and second chips 104, 120. For example, the optical adhesive 126 may include one or more of an epoxy, silicone, acrylate, or any combination thereof. In some examples, the optical adhesive 126 may be chosen such that thermal regulation between the first and second chips 104, 120 is hindered or prohibited, depending on whether heat transfer is a parameter for consideration at the lateral surfaces 128, 130.

Figure 4:
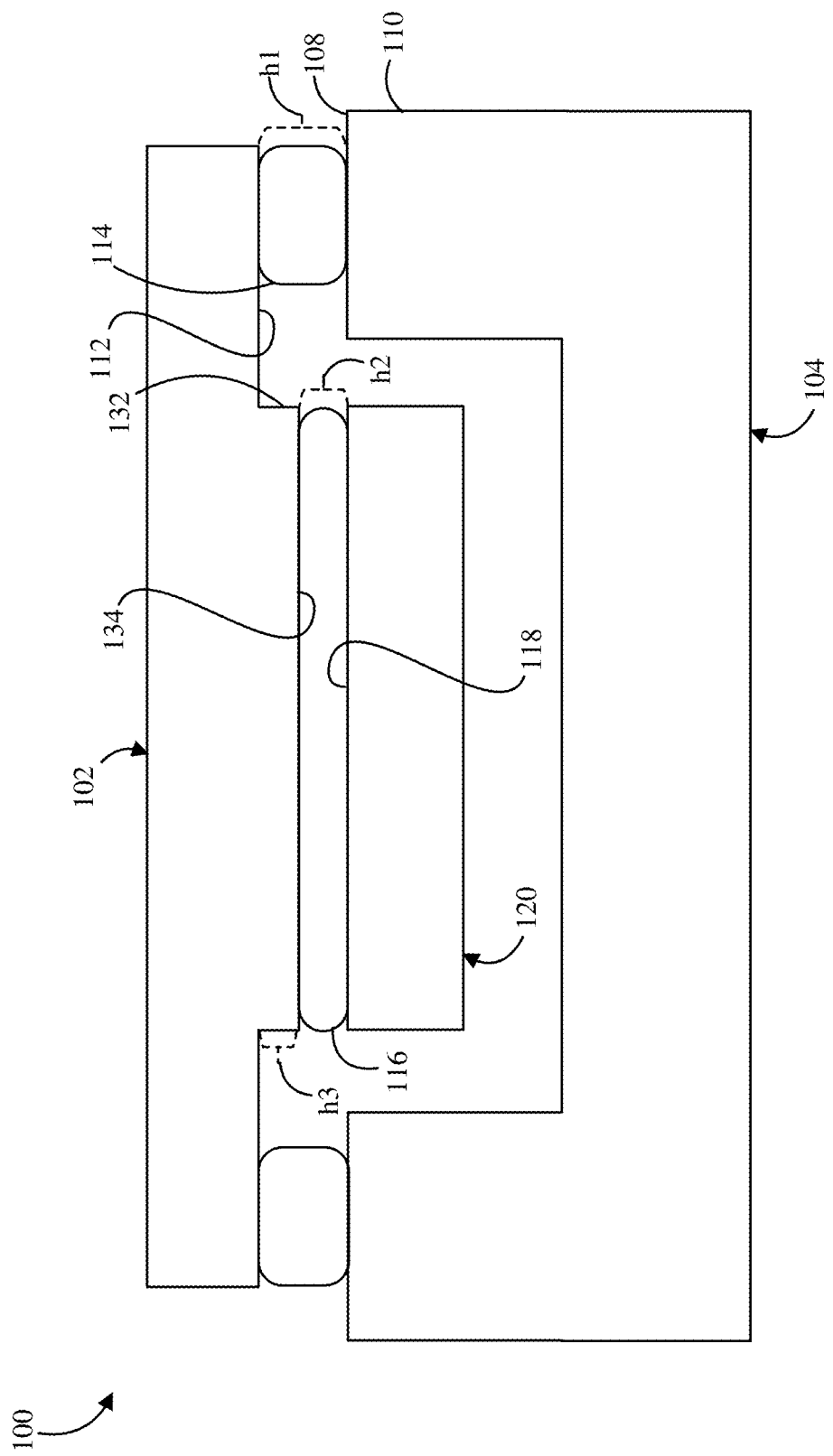
FIG. 4 is a cross-section view of another example of the apparatus along line II.

FIG. 4 is a cross-section view of another example of the apparatus 100 along line II. The carrier 102 is connected with the first chip 104 by the structural adhesive 114, which has a height (h1) that is measured from the elevated surface 108 to the bottom surface 112 of the carrier 102. The carrier 102 includes a protrusion 132 that extends from the bottom surface 112 of the carrier 102 to the top surface 118 of the second chip 120 so that the first and second chips 104, 120 can be properly aligned. The carrier 102 and the second chip 120 are connected at the carrier adhesive 116, which has a height (h2) that is measured from a distal portion 134 of the protrusion to the top surface 118 of the second chip 120. The protrusion 132 has a height (h3) measure from the bottom surface 112 of the carrier to the distal portion 134 of the protrusion 132.

The protrusion 132 functions to adjust the position of the second chip 120 relative to the connection point of the carrier 102, the first chip 104, and the structural adhesive 114. The protrusion 132 may have a width sufficient to mechanically anchor with the second chip 120 via the carrier adhesive 116. The protrusion 132 may have a width that is the same or different as a width of the second chip 120. The distal portion 134 of the protrusion 132 may have any configuration sufficient to adhere to the second chip 120. For example, the distal portion 134 may have a configuration that is flat, rounded, pointed, or any combination thereof. The protrusion 132 may have any height sufficient to optically align the first and second chip 104, 120. The height of the protrusion 132 may be chosen based on the coefficient of thermal expansion of the protrusion 132 and/or based on the coefficient of thermal expansion and/or height of the structural and/or carrier adhesive 114, 116. For example, the protrusion 132 may have a height of about 0.001 mm to about 0.2 mm.

The apparatus 100 may be arranged such that the second chip 120 is athermal. As stated above, athermal means that as the first and second chips 104, 120 are in use and generating heat the second chip 120 does not move relative to the first chip 104. Holding the second chip 120 in a fixed position allows the first and second chips 120 to remain optically aligned even when one or more components (e.g., the structural adhesive 114, the carrier adhesive 116, the carrier 102) have shifted due to thermal expansion.

In the example of FIG. 4, being athermal is based on the coefficients of thermal expansion and the relative heights of one or more of the components. Each of the heights and coefficients of thermal expansion (i.e., the materials used in the components that impact thermal expansion) may be chosen so that the second chip 120 remains athermal during operation of the apparatus. As shown, the first chip 104 and carrier 102 are connected by a structural adhesive 114, the carrier 102 includes a protrusion 132 that extends towards the second chip 120, and the second chip 120 is connected with the protrusion 132 by a carrier adhesive 116. For the second chip 120 to be athermal, the product of the coefficient of thermal expansion ($E_1$) and the height ($h_1$) for the structural adhesive 114 must be equal to the sum of the product of the coefficient of thermal expansion ($E_2$) and the height ($h_2$) for the carrier adhesive 116 and the product of the coefficient of thermal expansion ($E_3$) and the height ($h_3$) for the protrusion 132. In other examples, where a protrusion 132 is not included, the second chip 120 is athermal where the coefficient of thermal expansion ($E_1$) and the height ($h_1$) for the structural adhesive 114 is equal to the product of the coefficient of thermal expansion ($E_2$) and the height ($h_2$) for the carrier adhesive 116. The relationship that causes the second chip 120 to be athermal may be represented by equation 1:

$$E_1 * h_1 = E_2 * h_2 + E_3 * h_3 \qquad \text{Equation 1:}$$

Figure 5:
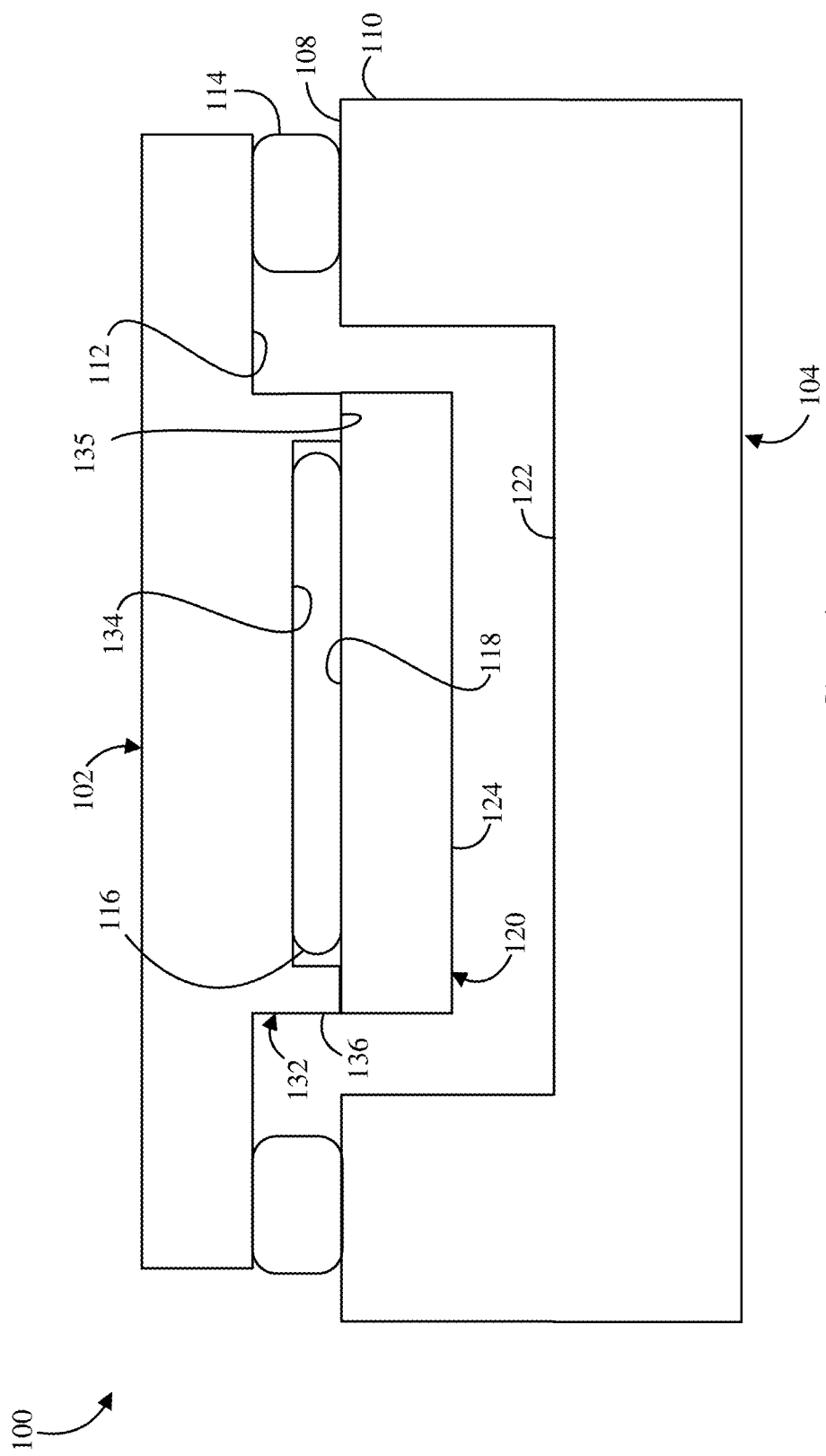
FIG. 5 is a cross-section view of another example of the apparatus along line II.
Figure 6:
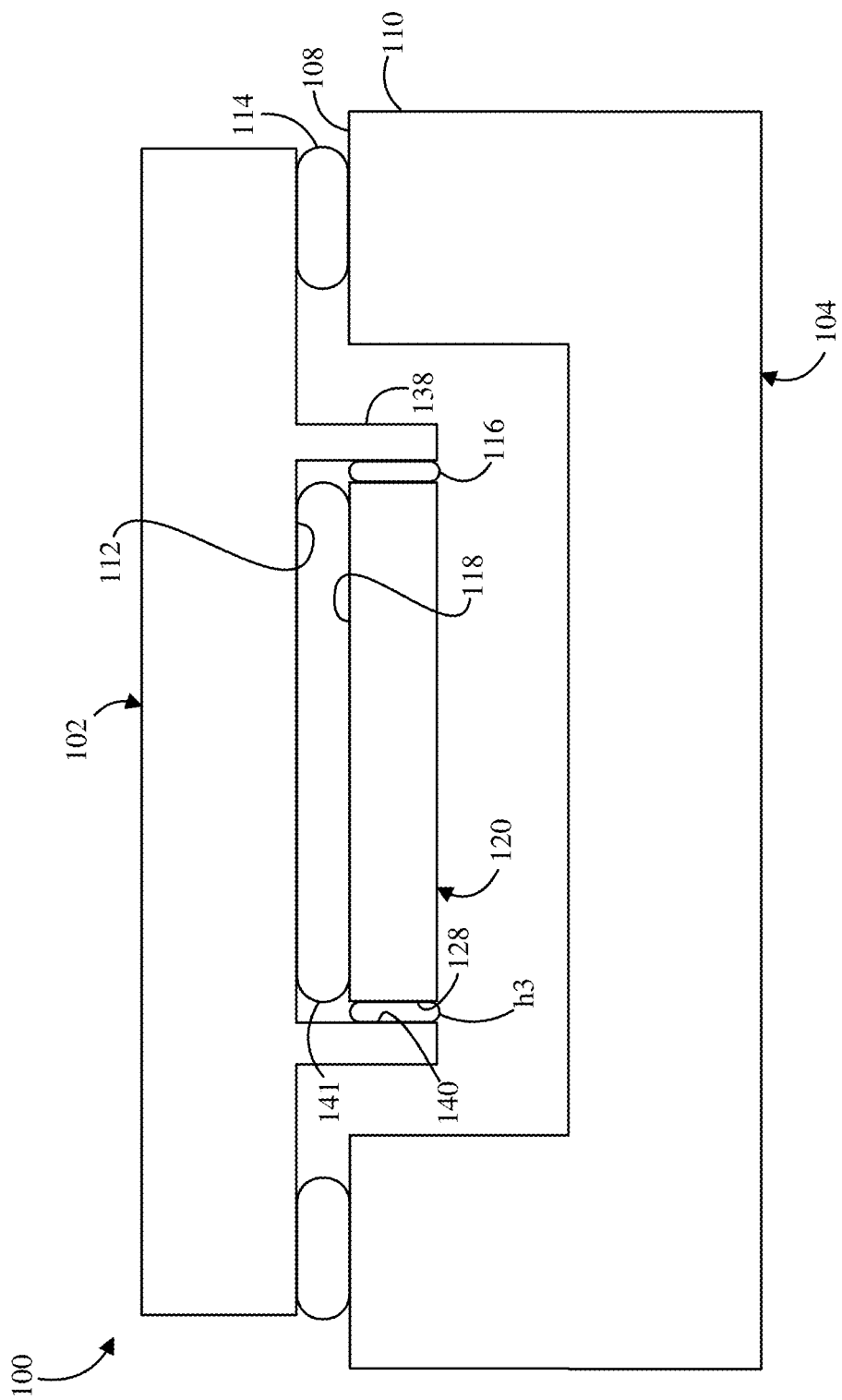
FIG. 6 is a cross-section view of another example of the apparatus along line II.

Equation 1 may be applied to apparatuses that include appendages (see the appendages 136 of FIG. 5) or extensions (see the extensions 138 of FIG. 6).

FIG. 5 is a cross-section view of another example of the apparatus 100 along line II. The carrier 102 and the first chip 104 are connected such that the first and second chips 104, 120 are aligned and free of contact at the bottom surfaces 122, 124. The carrier 102 includes the protrusion 132 extending from a distal portion 134 of the protrusion 132 towards the second chip 120, and the protrusion 132 includes appendages 136 that function to house the carrier adhesive 116 when the carrier 102 and the second chip 120 are connected. The appendages 136 are shown as two separate components, and in some examples, the appendages 136 may connect to form a contiguous wall around the carrier adhesive 116. In other words, the combination of the appendages 136, the top surface 118 of the second chip 120, and the distal portion 134 of the protrusion may form a closed housing for the carrier adhesive 116 so that the carrier adhesive does not leak or overflow from the carrier 102 and the second chip 120. In some examples, this housing configuration provides an advantage to the user assembling the apparatus 100 because the carrier 102 and the second component 120 can be connected at a consistent height, which improves consistent alignment of the first and second chips 104, 120 between different apparatuses 100.

The appendages 136 function to house the carrier adhesive 116 and to provide consistent lateral alignment of the first and second chips 104, 120. For example, with the appendages 136 determining the distance that that the second chip 120 extends from the carrier 102 (i.e., because the appendages 136 directly contact the top surface 118 of the second chip 120), variability in the height of the carrier adhesive 116 during assembly and/or curing is eliminated. The appendages 136 may extend from the protrusion 132 in any manner, direction, and/or orientation sufficient to contact the top surface 118 of the second chip 120. In some examples, the distal portion 135 of the appendages 136 is free of contact with the carrier adhesive 116 so that the position of the second chip 120 and the carrier 102 relative to the first chip 104 remains consistent between apparatuses 100 being assembled. In other examples, a portion of carrier adhesive 116 is position between the distal portion 135 of the appendages 136 and the top surface 118 of the second chip 120 to improve the connection between the carrier 102 and the second chip 120. The distal portion 135 of the appendage 136 may have any configuration sufficient to provide a pair of contact points with the second chip 120. For example, the distal portions 135 of the appendages 136 may be angled, rounded, flat, or any combination thereof. The appendages 136 may extend from the protrusion 132 at any angle sufficient to form a pair of contact points with the second chip 120 and house the carrier adhesive 116. For example, the appendages 136 may extend from the protrusion 132 at an angle of about 35 degrees to about 145 degrees.

FIG. 6 is a cross-section view of another example of the apparatus 100 along line II. The first chip 104 and the carrier 102 are connected at the structural adhesive 114, and the carrier 102 is connected with the second chip 120 at two positions. At the first position, the second chip 120 is connected with a mechanical connection at the extensions 138. Specifically, the carrier adhesive 116 connects the lateral surface 128 of the second chip and a lateral surface 140 of the extension 138. Between the extensions 138 and at the second position, a thermal interface material 141 provides a thermal connection between the carrier 102 and the second chip 120 during operation of the second chip 120. The extensions 138 may be separated by a distance such that there is sufficient room for the second chip 120 and such that the amount of the thermal interface material 141 is controlled during assembly of the carrier 102 and the second chip 120. The extensions 138 are configured to mechanically anchor the second chip 120 on at least two lateral surfaces 128. In some examples, in addition to the two lateral surfaces 128 shown, the extensions 138 mechanically anchor a third lateral surface (not shown) that does not interrupt the alignment or interactions between the first and second chips 104, 120. For example, the carrier 102 may include three extensions 138 that each contact a separate lateral surface 128 of the second chip 120, and at least one lateral surface 128 is free of contact with the extensions 138 so that the at least one lateral surface 128 that is free of contact with the extensions 138 can optically align with the first chip 104 via an optical adhesive (see the optical adhesive 126 of FIG. 3) or the like.

The extensions 138 function to secure the second chip 120 with the carrier 102. The extensions 138 may extend from the carrier 102 at any angle sufficient to laterally secure the second chip 120. For example, the extensions 138 may extend from the carrier at an angle of about 35 degrees to about 145 degrees, relative to the bottom surface of the carrier 102. The extensions 138 may be a contiguous part of the carrier 102, or the extensions 138 may be separate components that are affixed to the carrier 102. The extensions 138 may be used in conjunction with a protrusion, such as the protrusion 132 of FIGS. 4 and 5. In some examples, the extensions 138 connect at the lateral surfaces 128, and the thermal interface material 141 may be positioned between the second chip 120 and the protrusion 132. The extensions 138 may have any height sufficient to connect with the lateral surfaces 128 of the second chip and align the first and second chips 104, 120. For example, extensions may have a height of about 0.3 mm to about 1 mm.

The thermal interface material 141 functions to regulate energy between the carrier 102 and the second chip 120. The thermal interface material 141 may function to regulate an amount of energy so that energy generated by the second chip 120 does not crack the carrier adhesive 116. The thermal interface material 141 may include any material or compound sufficient to regulate the energy between the carrier 102 and the second chip 120. The thermal interface material may include one or more of an epoxy, silicone, urethane, acrylate, metal, aluminum oxide, boron nitride, zinc oxide, aluminum nitride, gallium, indium, tin, silver, ceramic, or any combination thereof. The thermal interface material 141 may have any form or configuration sufficient to improve energy transfer between the carrier 102 and the second chip 120. For example, the thermal interface material 141 may have a form of a thermal paste, thermal adhesive, thermal gap filler, thermally conductive pad, thermal tape, phase-change material, or any combination thereof. The thermal interface material 141 may have any height and/or width sufficient to provide high levels of thermal regulation between the second chip 120 and the carrier 102. For example, the thermal interface material 141 may have a height of about 0.005 mm to about 0.1 mm. The thermal interface material 141 may be applied in any amount sufficient to form thermal connection between the carrier 102 and the second chip 120. The amount of thermal interface material 141 may be chosen based on the size of the gap between the second chip 120, the extensions 138, and the bottom surface 112 of the carrier 102. The amount of thermal interface material 141 may be chosen based on the desired position for optical alignment between the first and second chips 104, 120, as generally shown in FIG. 3. For example, the thermal interface material 141 may be applied in an amount sufficient to fill the space between the extensions 138, the bottom surface 112, the carrier adhesive 116, and the top surface 118 and optically align the first and second chips 104, 120.

Generally, the method of the present disclosure includes connecting the carrier 102 that includes the second chip 120 with the first chip 104. To this end, the carrier 102 may be connected with the carrier 102 before connecting the carrier 102 and the second chip 120. Then, the carrier 102 may be connected with the first chip 104 such that the second chip 120 does not directly contact the first chip 104, and therefore, the transfer of thermal energy between the first and second chips 104, 120 is mitigated, which lengthens the amount of time that the first and second chips 104, 120 can be used before either are overheated and/or reduces performance issues due to each of the first and second chips 104, 120 being subjected to different temperatures. To connect any of the components, an adhesive may be used, and one or more curing steps may be implemented to activate adhesive and connect the parts. These general methods may be applied to any of the examples shown in FIGS. 1-6.

Figure 7A:
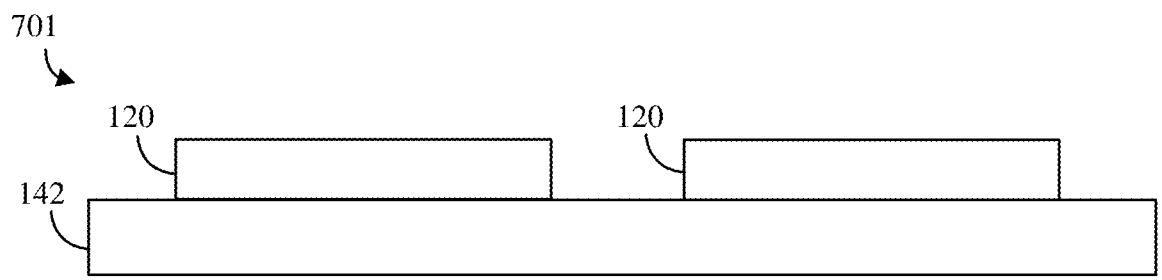
FIG. 7A shows a first step in the assembly of the carrier and the second chip.
Figure 7B:
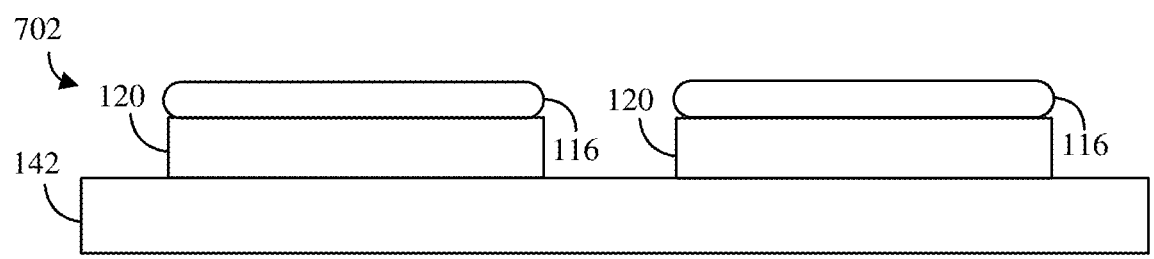
FIG. 7B shows a second step in the assembly of the carrier and the second chip.
Figure 7C:
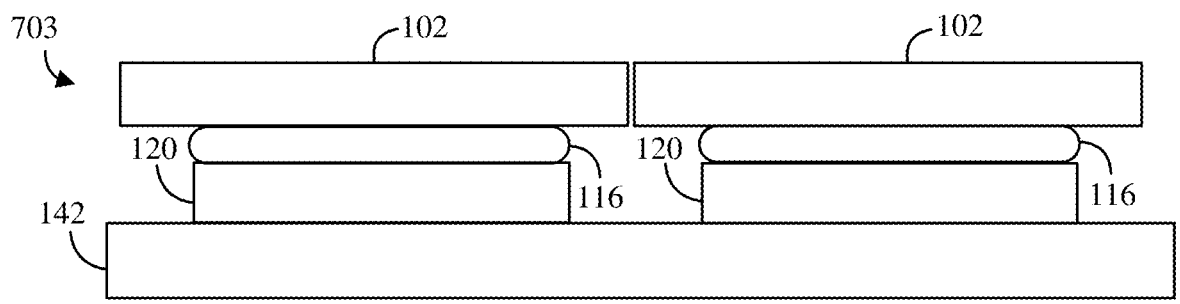
FIG. 7C shows a third step in the assembly of the carrier and the second chip.

FIG. 7A shows a first step 701 in the assembly of the carrier 102 and the second chip 120. FIG. 7B shows a second step 702 in the assembly of the carrier 102 and the second chip 120. FIG. 7C shows a third step 703 in the assembly of the carrier 102 and the second chip 120. FIGS. 7A-7C may represent cross-section or side views of the carrier 102 and/or second chip 120.

In the first step 701, the second chip 120 is placed or affixed to a tape 142 so that during assembly of the carrier 102 and second chip 120 combination the components do not shift or misalign. The tape 142 may include any compound sufficient to form a releasable connection with the second chip 120. The tape 142 may be configured to secure as many second chips 120 as desired so that many combinations of the second chips 120 and carriers 102 are assembled on the tape 142, which then can be utilized to assemble many apparatuses (e.g., FIGS. 8A-8C) in a short period of time.

The tape 142 may function to prevent undesirable shifting of the second chip 120, the carrier adhesive 116, and/or the carrier 102 during any of the first, second, and/or third steps 701, 702, 703 of FIGS. 7A-7C. The tape 142 may included with or may be a substrate that is rigid so that the tape 142 does not shift during the first, second, and/or third steps 701, 702, 703. The tape 142 may be configured such that the tape 142 does not form a permanent connection with the second chip 120 during any of the first, second, and/or third steps 701, 702, 703, such as when a curing step is applied to cure the carrier adhesive 116.

In the second step 702, the carrier adhesive 116 is disposed or deposited on the second chip 120. The carrier adhesive 116 may be deposited or disposed on the second chip 120 in any amount sufficient to connect the second chip 120 and the carrier 102. The carrier adhesive 116 may be limited to an amount that will not overflow and leak on to the tape 142. In some examples, the carrier adhesive 116 may be deposited or disposed in an amount on the carrier 102 sufficient to partially adhere to the carrier 102 while the carrier 102 and carrier adhesive 116 are contacted with the second chip 120. In some examples, an amount of carrier adhesive 116 is disposed or deposited on both the carrier 102 and the second chip 120, before connecting the carrier 102 and the second chip 120. To prevent overflow of the carrier adhesive 116, the carrier adhesive 116 may be partially cured immediately after application to the second chip 120, and the structural adhesive may be completely cured during the third step 703. The partial curing of the carrier adhesive 116 may assist with controlling the height of the carrier adhesive 116 before or during assembly with the carrier 102. Controlling the height of the carrier adhesive 116 may be important so desirable alignment between the first and second chips 104, 120 is achieved, even during periods where one or both of the first and second chips 104, 120 are generating high amounts of energy during operation.

In the third step 703, the carrier 102 is connected with or affixed to the second chip 120 via connecting at the carrier adhesive 116. Where multiple of the combination of the carriers 102 and the second chips 120 are being assembled, the carriers 102 may be connected with the second chips 120 in any fashion such that assembly of an adjacent combination is not affected by undesirable contact between other combinations. Connecting the carrier 102 and the second chip 120 may include any technique sufficient to form a permanent connection between the carrier 102 and the second chip 120. For example, the carrier 102 may be contacted with the carrier adhesive 116, which is deposited or disposed on the second chip, and the carrier adhesive 116 may be cured by any technique known to the skilled artisan. For example, the carrier adhesive 116 may be cured by heat, ultraviolet radiation, moisture, oxygen, air, pressure, or any combination of techniques thereof. After connecting the carrier 102 and the second chip 120, the combination may be removed from the tape 142 by any means sufficient to disconnect the second chip 120 and the tape 142. For example, the combination of the carrier 102 and the second chip 120 may simply be picked up and/or peeled or pulled from the tape 142 using a gripping device that does not damage the components, such as a vacuum.

Although not shown, the first, second, and third steps 701, 702, 703 may include a combination of steps so that a thermal interface material (e.g., the thermal interface material 141 of FIG. 6) may be utilized. Where a thermal interface material is used, the carrier 102 may include extensions (e.g., the extensions 138 of FIG. 6), and the thermal interface material may be deposited or disposed on the carrier 102. Then, the carrier 102 may include extensions 138 that each have an amount of carrier adhesive 116 applied to an interior surface of the extensions 138. The carrier 102 including the extensions 138 and the carrier adhesive 116 may be contacted with lateral surfaces (e.g., the lateral surfaces 128 of FIG. 6) of the second chip 120 and the thermal interface material that is disposed on the second chip 120. In some examples, the carrier adhesive 116 is not applied to the carrier 102 or the second chip 120 until after the carrier 102 is contacted with the thermal interface material. In some examples, the carrier adhesive 116 is applied to the second chip 120 before contacting the carrier 102 and the thermal interface material. The carrier adhesive 116 may be cured at the lateral surfaces before or after using the carrier 102 to assemble the apparatus 100 in the first, second, and third steps 801, 802, and 803 of FIGS. 8A-8C.

Figure 8A:
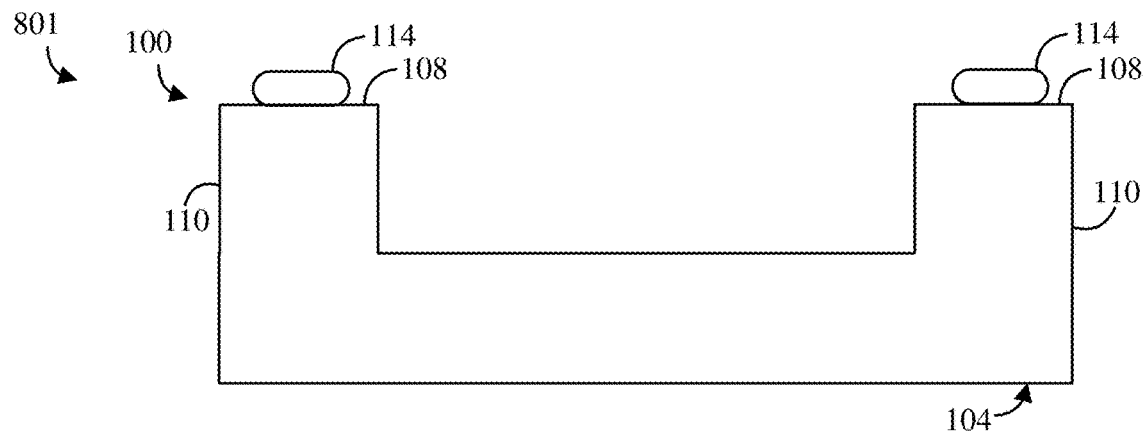
FIG. 8A shows a first step in the assembly of the apparatus.
Figure 8B:
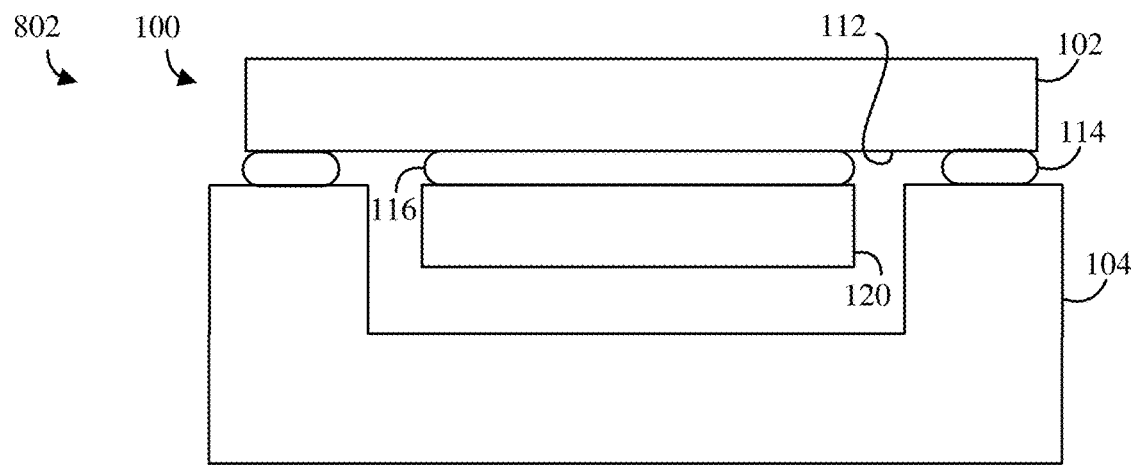
FIG. 8B shows a second step in the assembly of the apparatus.
Figure 8C:
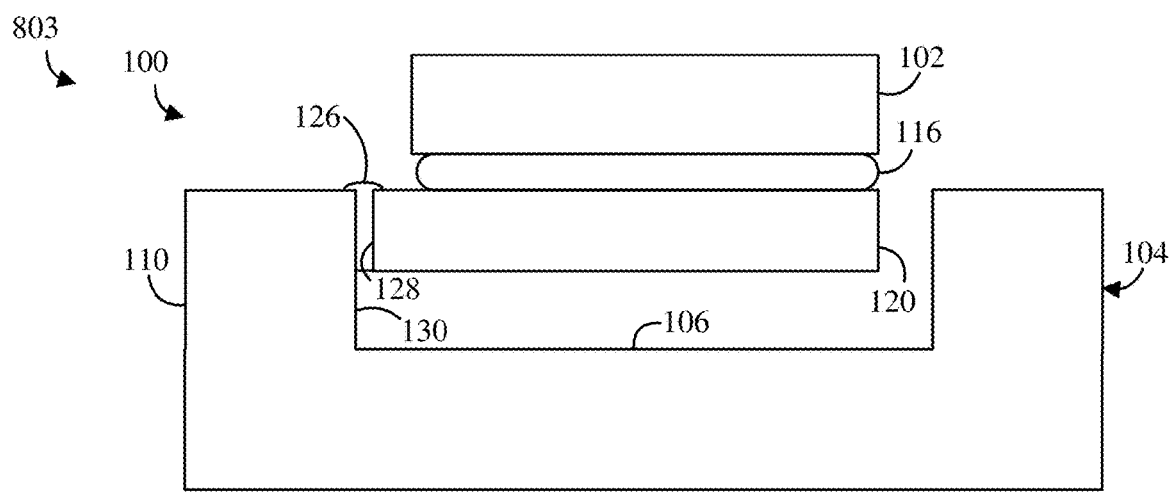
FIG. 8C shows a third step in the assembly of the apparatus.

FIG. 8A shows a first step 801 in the assembly of the apparatus 100. FIG. 8B shows a second step 802 in the assembly of the apparatus 100. FIG. 8C shows a third step 803 in the assembly of the apparatus 100. FIGS. 8A-8C may represent cross-section and/or side views of the apparatus 100. The cross-sections and/or side views of FIGS. 8A-8C may be cross-sections or sides viewed at different angles. For example, FIGS. 8A and/or 8B may be a cross-section view along line II of FIG. 1. For example, FIG. 8C may be a cross-section view along line III of FIG. 1.

In the first step 801, an amount of structural adhesive 114 is disposed or deposited on the elevated surfaces 108 of the lateral walls 110 in any amount sufficient to form an adequate connection between the carrier 102 and the second chip 104. The amount of the structure adhesive 114 may be limited so that the structural adhesive does not overflow from the elevated surfaces 108 before a curing step and negatively impact other components of the apparatus 100 or otherwise cause undesirable positioning of the structural adhesive 114. The structural adhesive 114 may be deposited or disposed in a technique or method such that the structural adhesive 114 does not contact or interact with the optical adhesive 126 (see FIG. 8C) due to overflow. To prevent overflow of the structural adhesive 114, the structural adhesive 114 may be partially cured immediately after application to the first chip 104, and the structural adhesive may be completely cured during the second and/or third steps 802, 803. The partial curing of the structural adhesive 114 may assist with controlling the height of the structural adhesive 114 before or during assembly with the carrier 102. Controlling the height of the structural adhesive 114 may be important so desirable optical alignment between the first and second chips 104, 120 is achieved, even during periods where one or both of the first and second chips 104, 120 are generating high amounts of heat during operation.

In the second step 802, the carrier 102, which includes the second chip 120 and the carrier adhesive 116, is connected with the first chip 104 at the bottom surface 112 of the carrier 102 by any means sufficient to form a permanent connection between the components. The carrier 102 and the first chip 104 may be connected in any fashion sufficient to align the first and second chips 104, 120. The carrier 102 and the first chip 104 are connected by the structural adhesive 114. After contacting the carrier 102 and the first chip 104 at the structural adhesive, the structural adhesive 114 may be cured by any known technique. For example, the structural adhesive 114 may be cured by heat, ultraviolet radiation, moisture, oxygen, pressure, catalytic reaction or any combination thereof. Before curing, the structural and carrier adhesives 114, 116 may each have a height that is chosen so that, when the first and second chips 104, 120 are in use and generating energy, the first and second chips 104, 120 remain optically aligned as one or more components (e.g., the first chip 104, the carrier 102, the structural adhesive 114, the carrier adhesive 116, and/or the second chip 120) of the apparatus 100 thermally expand.

The third step 803 may be optional, and whether the third step 803 is implemented is determined based on if the first and second chips 104, 120 utilize the optical adhesive 126 or some other connecting component. In the third step 803, second chip 120 is connected with the first chip 104 via any intervening component sufficient to align the first and second chip 104, 120. As shown in FIG. 8C, the optical adhesive 126 is used to connect lateral surfaces 128, 130 of the first and second chips 104, 120. The optical adhesive 126 may be disposed, deposited, or applied between the first and second chips 104, 120 in any amount or by any technique sufficient to connect the first and second chip 104, 120 and avoid overflow of the optical adhesive 126 to the carrier adhesive 116 and/or cavity 106 before curing. The third step 803 may include a curing step to permanently connect the carrier 102 and the first chip 104 at the structural adhesive 114 (shown in FIG. 8B) and/or the first and second chips 120, 104 at the optical adhesive 126. The curing step may be performed by any known technique. For example, the optical adhesive may be cured by heat, moisture, oxygen, ultraviolet radiation, pressure, addition cure, condensation cure, catalytic reaction, or any combination thereof.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An apparatus, comprising:
    a first chip comprising a cavity located between lateral walls of the first chip; and
    a carrier mechanically anchored with the first chip at a top portion of the lateral walls, the carrier comprising a second chip configured to optically align with the first chip at a side portion of one of the lateral walls,
    wherein the first and second chips are free of contact at a bottom surface of the second chip and a bottom surface of the cavity.

2. The apparatus of claim 1, wherein the second chip and the carrier are mechanically anchored together by a carrier adhesive that is more thermally conductive than air.

3. The apparatus of claim 2, wherein the carrier and the first chip are mechanically anchored at the top portion of the lateral walls by a structural adhesive.

4. The apparatus of claim 1, wherein the carrier further comprises a protrusion that extends a distance from a bottom surface of the carrier and connects with the second chip.

5. The apparatus of claim 4, wherein the protrusion connects with the second chip by a carrier adhesive that is more thermally conductive than air, and wherein the protrusion comprises appendages that extend from the protrusion and contact the second chip so that the second chip connects with the protrusion and so that a top surface of the second chip and a bottom surface of the carrier are parallel.

6. The apparatus of claim 1, wherein the carrier further comprises extensions that protrude from the bottom surface of the carrier and mechanically anchor lateral surfaces of the second chip to the carrier so that a top surface of the second chip and the bottom surface of the carrier are aligned in a parallel orientation.

7. The apparatus of claim 6, wherein the extensions mechanically anchor the lateral surfaces of the second chip by an extension adhesive.

8. The apparatus of claim 7, wherein the carrier further comprises a thermal interface material that regulates energy between the second chip and the carrier, and wherein the bottom surface of the carrier and the top surface of the second chip are free of contact.

9. The apparatus of claim 1, wherein the second chip is connected with the first chip at the lateral walls of the cavity by an optical adhesive.

10. An apparatus, comprising:
 a first chip comprising a cavity; and
 a carrier mechanically anchored with one or more elevated surfaces of the first chip, the carrier comprising
  a second chip that is connected with the carrier at a bottom surface of the carrier and a top surface of the second chip by a thermal interface material; and
  extensions that protrude from the bottom surface of the carrier and mechanically anchor lateral surfaces of the second chip to the carrier.

11. The apparatus of claim 10, wherein the second chip is free of contact with the first chip at a bottom surface of the second chip and a bottom surface of the cavity.

12. The apparatus of claim 11, wherein the second chip is configured to optically align with the first chip at lateral surfaces of the cavity.

13. The apparatus of claim 11, wherein the second chip is connected with the first chip at a lateral wall of the cavity by an optical adhesive.

* * * * *